US008936903B2

(12) United States Patent
Chang et al.

(10) Patent No.: US 8,936,903 B2
(45) Date of Patent: Jan. 20, 2015

(54) PHOTO-RESIST WITH FLOATING ACID

(71) Applicant: Taiwan Semiconductor Manufacturing Company, Ltd., Hsin-Chu (TW)

(72) Inventors: Ching-Yu Chang, Yilang County (TW); Ming-Feng Shieh, Yongkang (TW); Wen-Hung Tseng, Luodong Township, Yilan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 28 days.

(21) Appl. No.: 13/791,992

(22) Filed: Mar. 9, 2013

(65) Prior Publication Data

US 2014/0255850 A1    Sep. 11, 2014

(51) Int. Cl.
*G03F 7/26* (2006.01)
*G03F 7/004* (2006.01)

(52) U.S. Cl.
CPC .................................... *G03F 7/004* (2013.01)
USPC ........................................ 430/311; 430/270.1

(58) Field of Classification Search
CPC .................... H01L 21/32139; H01L 21/0274; H01L 21/31144; H01L 21/308; H01L 21/0273; G03F 7/0392; G03F 7/2041; G03F 7/0045; G03F 7/004; G03F 7/40; G03F 7/20; G03F 7/0382; G03F 7/0233; G03F 7/038; G03F 7/00; G03F 7/38; G03F 7/028; G03F 7/2024; G03F 7/30; G03F 7/32; G03F 7/70341; G03F 7/0035
USPC ................................................. 430/311, 270.1
See application file for complete search history.

(56) References Cited

U.S. PATENT DOCUMENTS

| 2004/0013975 | A1* | 1/2004 | Kon et al. ................... 430/270.1 |
| 2007/0122734 | A1* | 5/2007 | Roberts et al. ............. 430/270.1 |
| 2007/0166640 | A1* | 7/2007 | Wei ............................ 430/270.1 |
| 2010/0119970 | A1* | 5/2010 | Ohsawa et al. ............ 430/270.1 |
| 2011/0294069 | A1* | 12/2011 | Bae et al. ................... 430/283.1 |

* cited by examiner

*Primary Examiner* — Caleen Sullivan
(74) *Attorney, Agent, or Firm* — Haynes and Boone, LLP

(57) ABSTRACT

A method for fabricating a semiconductor product includes applying a photo-resist layer to a substrate, the photo-resist layer including a higher acid concentration at an upper portion of the photo-resist layer than at a lower portion of the photo-resist layer. The method also includes exposing the photo-resist layer to a light source through a mask including a feature, the photo-resist layer including a floating, diffusing acid that will diffuse into a region of the photo-resist layer affected by the feature while not diffusing into a feature formed by the mask.

20 Claims, 5 Drawing Sheets

PHOTO-RESIST WITH FLOATING ACID

BACKGROUND

Photolithography is a common technique used in the manufacture of semiconductor products. Photolithography processes involve the formation of features by using a photomask to expose certain regions of a photo-resist layer to light. The exposed or unexposed regions are then developed away to expose a semiconductor layer underneath the photo-resist. The exposed semiconductor layer can then have various processes performed thereon such as etching or doping.

Conventional methods for improving resolution usually include using a quencher, photo decomposable base (PDB) or photo decomposable quencher (PDQ) and a photo-acid generator (PAG) in the photoresist layer. The quencher is a base molecule that can neutralize the acid to quench a chemically amplified reaction (CAR). The PDB or PDQ is a base and typically becomes less basic after exposure. The PAG generates an acid after exposure.

One way to selectively develop regions of a photo-resist material is to expose certain regions to light through a mask. Some masks include scattering bars along the side of various features. The scattering bar helps with the exposure process. Nevertheless, the scattering bars can adversely affect the photo-resist material by blocking light where light should not be blocked. As a result, some or all of the scattering bars can printout onto the underlying area. It is thus desirable to be able to use scattering bars while not causing printout from the scattering bars onto the layer underneath the photo-resist layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
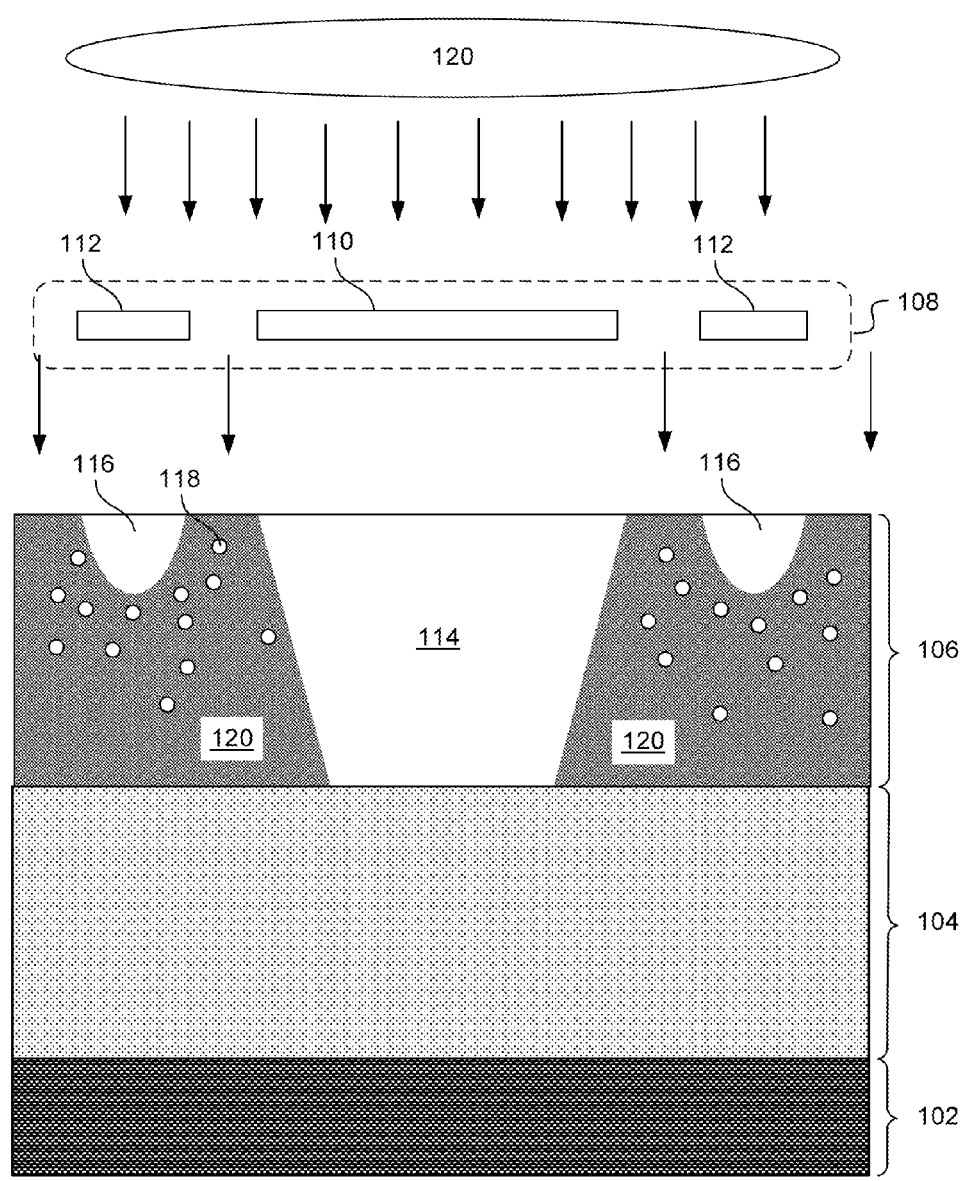
FIG. 1 is a diagram showing an illustrative photo-resist exposure process, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure provides a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

FIG. 1 is a diagram showing an illustrative photo-resist exposure process. The process involves a substrate 102, a hard mask layer 104, a positive tone photo-resist layer 106, and a photo-mask 108. According to the present example, the substrate 102 is a semiconductor substrate 102 such as a semiconductor wafer or other suitable device. The semiconductor substrate 102 may be made from any suitable semiconductor material, and include various features such as various doped regions, dielectric features, and/or multilevel interconnects.

The hard mask layer 104 is used to protect certain regions of the semiconductor substrate 102 from various photolithographic processes such as etching and doping. A pattern is formed into the hard mask 104 to allow the doping or etching processes to be selectively applied to the substrate 102.

The photolithographic process involves the application of the photo-resist layer 106. In the present example, the photo-resist layer 106 is such that areas exposed to a light source 120 become insoluble to a developing solution. Specifically, the light causes a chemical reaction in the photo-resist layer 106 that creates acid components within the exposed region. The developing solution is selected so that areas with acid will remain, while areas of the photo-resist layer without acid components are developed away. Such a developing solution is a negative tone developing solution.

The exposure energy source may be a variety of sources, including a deep ultra-violet (DUV) source. In one example, the energy source may be an Extreme UltraViolet (EUV) exposure. In some examples, other energy sources such as electron beam (e-beam) writing. Alternatively, the exposure process may utilize other exposure beams, such as ion beam, x-ray, and other proper exposure energy.

The photo mask 108 is used to expose certain regions of the photo-resist layer 106 to the light source 120 while blocking the light at regions that are intended to be developed away. Using such a mask, a lot more area of the photo-resist is exposed to the light than is blocked. Thus, such a mask is often referred to as a bright field mask 108.

When forming pattern features in the nanometer range, issues arise in the precision of a mask feature due to the wavelength of the light from the light source 120. One way to minimize such issues is through use of a scattering bar 112. A scattering bar within a bright field mask 108 is a small line formed along a feature 110. For example, if a particular feature 110 is a line, than scattering bars will be placed along that line on both sides. This helps protect the area of the photo-resist layer that is intended to be blocked from the light source 120. Moreover, higher precision features that are less prone to error may be formed the process window for the features is enlarged through use of a scattering bar 112.

Use of a scattering bar, however, may create some problems. Specifically, the scattering bar will also block light and form regions 116 that are void of acid and will thus be developed away, which is not desirable. In some cases, this can cause unintended features to be printed onto the layer beneath the photo-resist layer, in this case, the hard mask layer 104. This is referred to as printout. Printout can lead to errors in the final semiconductor product. Thus it is desirable to reduce or eliminate this printout. While reducing the width of the scattering bars 112 can help, the width can only be reduced so much as the mask approaches a minimum feature size.

According to certain illustrative examples, the photo-resist layer 106 is such that a higher acid concentration is formed at the top of the layer than at the bottom of the layer after exposure. This can be done by having floating acid components 118 such as floating Photo Acid Generator components. Thus, acid components tend to float towards the top of the layer 106, causing a higher concentration towards the top.

FIG. 1 illustrates the photo-resist layer 106 in varying shades. The white regions 114, 116 illustrate regions that were blocked from the light source 120 and thus no acid was created. These regions will be developed away with the appropriate developing solution. The shaded regions 120 represent regions that were exposed to light, causing an acid creating chemical reaction. The floating acid components 118 are shown for illustrative purposes, but do not represent an accurately scaled size of such components. There is a higher concentration of floating acid components 118 on the top of the layer 106 than at the bottom of the layer 106 because of the floating acid components.

Figure 2:
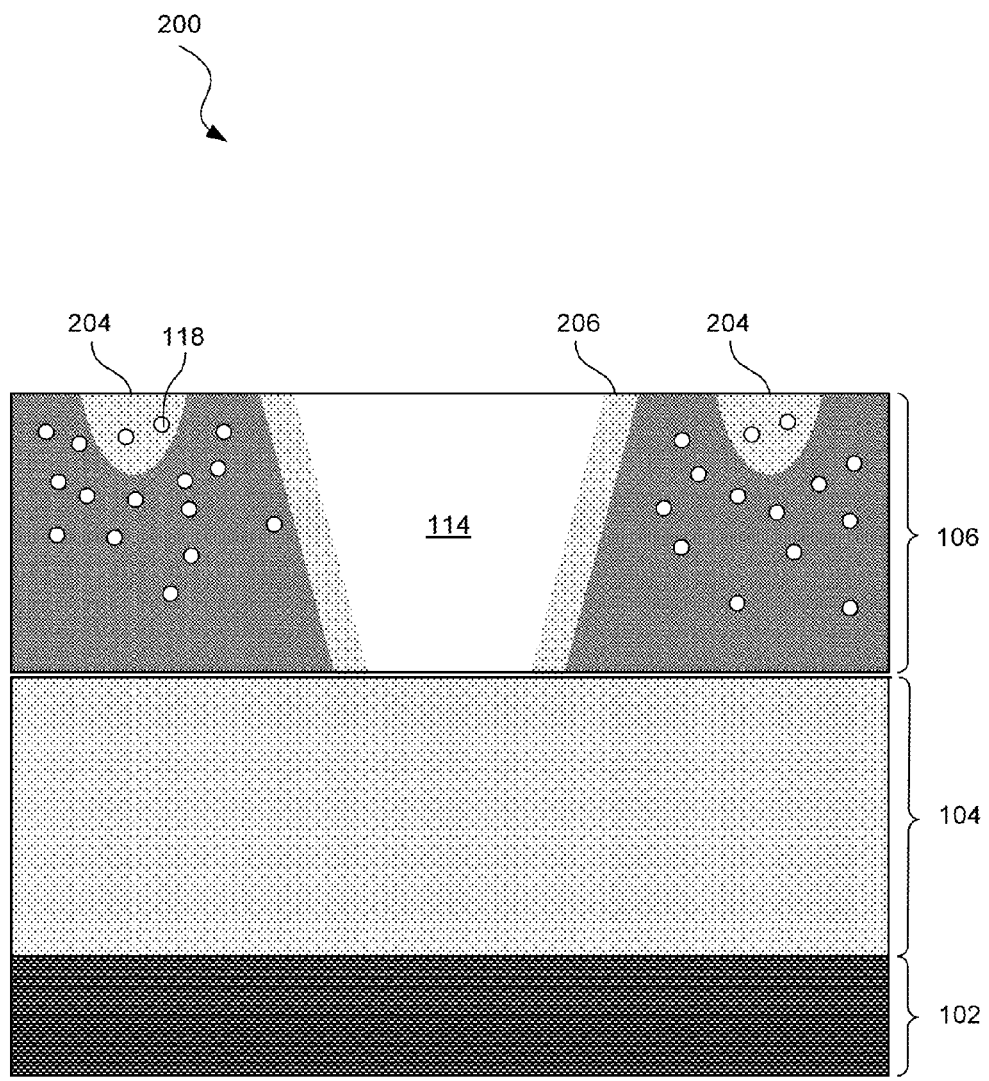
FIG. 2 is a diagram showing an illustrative acid diffusion process, according to one example of principles described herein.

FIG. 2 is a diagram showing an illustrative acid diffusion process 200. As mentioned above, the exposure to light creates a chemical reaction within the photo-resist layer that creates acid generating components. The acid makes the photo-resist layer insoluble to a particular type of developing solution. The mask is designed such that the features to be formed into the photo-resist are opaque and thus block light from a light source 120. The scattering bars, however, also block light in an undesired manner.

The floating acid components are such that they will diffuse into the smaller acid void regions left by the scattering bars. While there will be some diffusion into the region of the photo-resist that is intended to be a feature 114, this diffusion will not be enough to adversely affect that feature 114.

FIG. 2 also uses different shades to represent different aspects. Again, the white regions 114 represent areas that are without acid. Likewise, the dark shaded regions represent areas that were exposed to the light and thus are filled with acid. The lightly shaded regions 204, 206 represent areas where the floating acid components diffused into the acid void regions. As illustrated, the smaller regions left by the scattering regions become filled with acid, and thus remain insoluble to the appropriate developing solution. While there is some diffusion into the features 114 formed by the mask, the diffusion does not adversely affect the feature 114. Particularly, the amount of diffusion is small compared to the overall size of the feature 114 and thus the feature remains substantially intact. Because there is still no acid in the region of the feature 114, this region gets developed away, exposing the hard mask layer 104 underneath.

There are a number of mechanisms that may be used to cause the acid generator components to float up. In one example, the alkyl groups of a standard PAG component can be replaced with alkyl fluoride groups. The alkyl fluoride groups may be straight, branch, cyclic, or any combination thereof. The alkyl fluoride groups may contain at least two carbon units for both the cation unit and the anion unit. In some examples, an alkyl group is added, and then connected to an alkyl fluoride group.

Examples of the PAG, that is, a compound capable of generating an acid upon exposure, are given below. It should be understood that they may be used alone or in admixture of two or more. Suitable PAGs include onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

In an exemplary embodiment, the PAG is represented by one of the following structures:

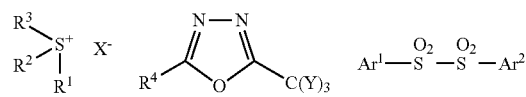

-continued

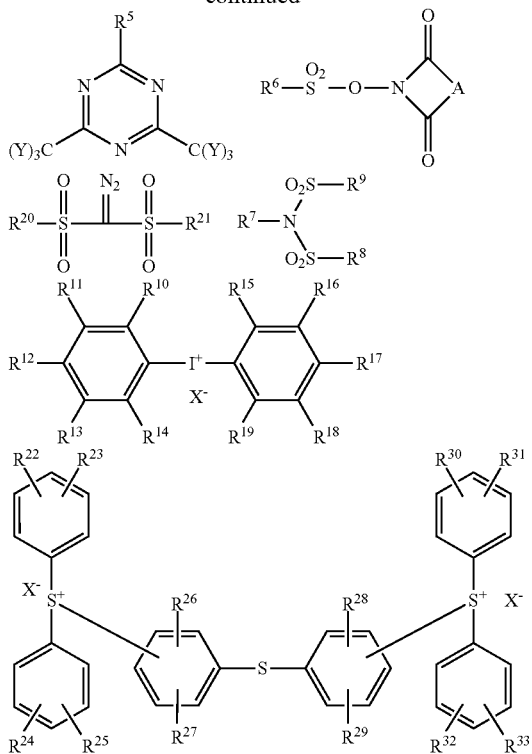

R¹-R³³ may be the same or different and each represents a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 1 to 20 carbon atoms. R¹-R³³ may bind together to form a ring. X⁻ represents a counter ion, such as $BF^{-4}$, $AsF_6^-$, $PF^{-6}$, $SBF_6^-$, $SiF^{-6}$, $ClO^{-4}$, perfluoroalkanesulfonic acid anion, alkylsulfoni anion, armomatic sulfonic acid anion, benzesulfonic acid anion or triisopropylbenzenesulfonic anion, a condensed polycyclic aromatic sulfonic acid anion, or a dye containing sulfonic acid. Ar¹ and Ar² may be the same or different, each representing an unsubstituted or substituted aryl group. A represents an unsubstituted or substituted alkylene group, a substituted or unsubstituted alkylene group or a substituted or unsubstituted arylene group. I⁺ represents the iodonium ion. Y represents a chlorine or bromine atom.

In some examples, the acid generator components may be made to float through use of a floating Thermal Acid Generator (TAG). The TAG components may have the following formulas: $RCOO-CH_2CF_2SO_3^-H^+$, and $RCOO-CH_2CF_2SO_3^-(R^1)_4N^+$. The R represents a substituted or unsubstituted linear, branched, or cyclic alkyl group having 1 to 20 carbon atoms, or a substituted or unsubstituted aryl group having 6 to 14 carbon atoms, and R1 represents a hydrogen atom, a substituted or unsubstituted linear, branched, or cyclic alkyl group, alkenyl group, ozoalkyl group having 1 to 10 carbon atoms, aryl group, aralkyl group, aryloxoalkyl group having 6 to 18 carbon atoms.

Other forms of floating acid may be used. For example, various organic acids and free acids may be used in accordance with principles described herein. Particularly, acids that tend to float up and cause diffusion into smaller regions affected by a scattering bar during exposure by a mask.

Figure 3A:
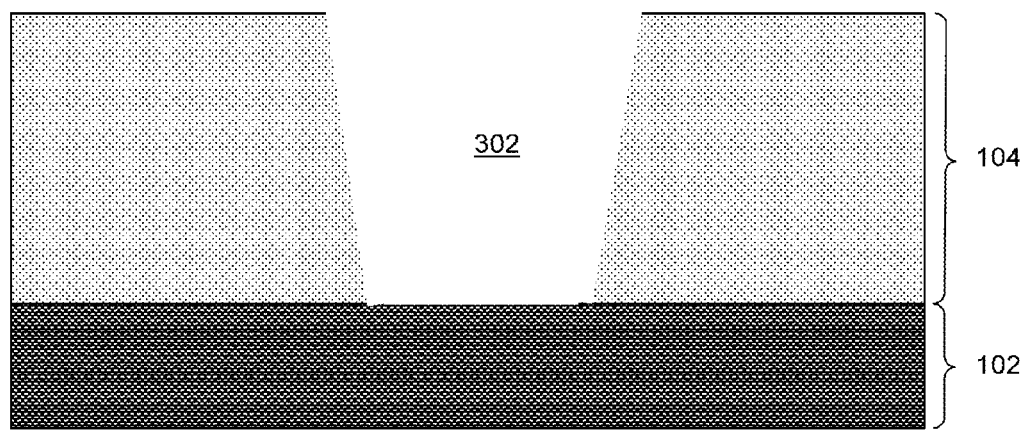
FIGS. 3A and 3B are diagrams showing the difference between a hard mask layer with and without use of an acid diffusing photo-resist layer, according to one example of principles described herein.
Figure 3B:
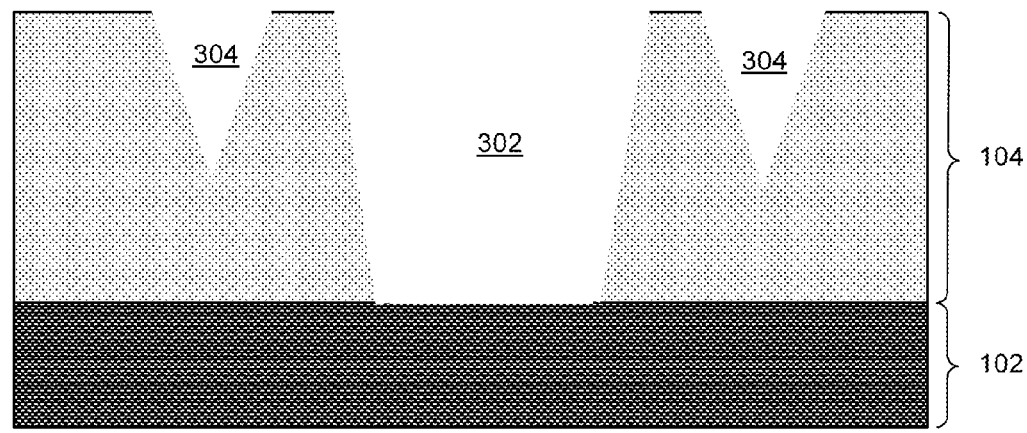

FIGS. 3A and 3B are diagrams 300 showing the difference between a hard mask layer 104 with and without use of an acid diffusing photo-resist layer. FIG. 3A illustrates the example described above in which a photo-resist with floating acid components is used. After the photo-resist has been developed away, an etching process can be performed on the hard mask. After the etching process, the photo-resist layer is removed entirely, leaving the hard mask layer on top of the substrate. The hard mask layer 104 may be used to protect the substrate from certain photolithographic processes that are intended for certain regions as defined by the patterns. As illustrated, a feature 302 within the pattern extends through the hard mask 104 to the substrate 102. There is no printout from the scattering bars.

FIG. 3B, alternatively, illustrates what may occur if the acid-diffusion does not move acid into regions blocked by the scattering bars. Specifically, those regions will become developed away, and in some cases, they may extend through the entire photo-resist material such that unwanted features 304 will be formed into the hard mask 104. This can cause problems with further photolithographic processes applied to the substrate 102.

Figure 4A:
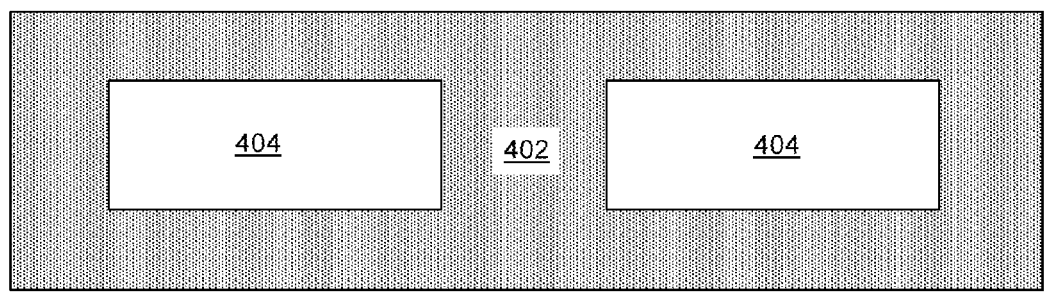
FIGS. 4A-4C are diagrams showing illustrative top views of features formed with and without using a floating acid photo-resist, according to one example of principles described herein.
Figure 4B:
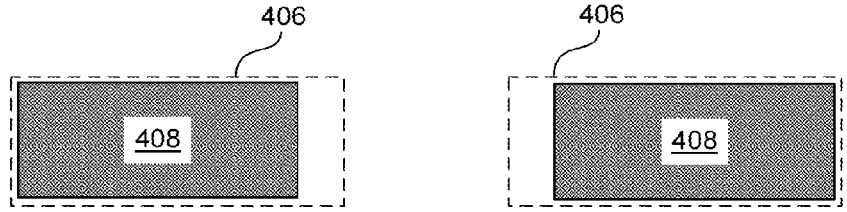
Figure 4C:
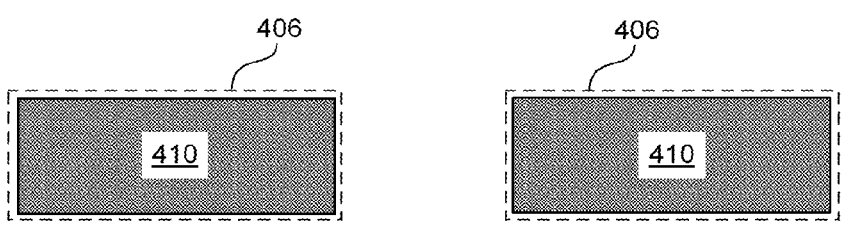

FIGS. 4A-4C are diagrams showing illustrative top views of features formed with and without using a floating acid photo-resist. Using a photo-resist with material with floating acid generator components may provide a number of benefits. For example, when using traditional photolithographic techniques, line ends may sometimes shrink. The shrinking of line ends can be reduced by using a photo-resist in accordance with principles described herein.

FIG. 4A is a diagram showing an illustrative mask 400 with two line ends that may be prone to shrinking. The white area illustrates the opaque region 402 of the mask 400. The shaded regions represent transparent regions 404 of the dark field mask 400. These transparent regions are used to define features into the photo-resist material.

FIG. 4B is a diagram showing an illustrative top view of features formed into the photo-resist material using traditional photolithographic techniques. According to the present example, the line ends of the features 408 shrink in comparison to the mask features 406. In contrast, FIG. 4C is a diagram showing an illustrative top view of features formed into a photo-resist material having properties described herein. Particularly, the floating acid reduces the shrinking that occurs at the line ends. As illustrated, the features 410 formed into the photo-resist material more closely match the features 406 of the mask 400.

Figure 5:
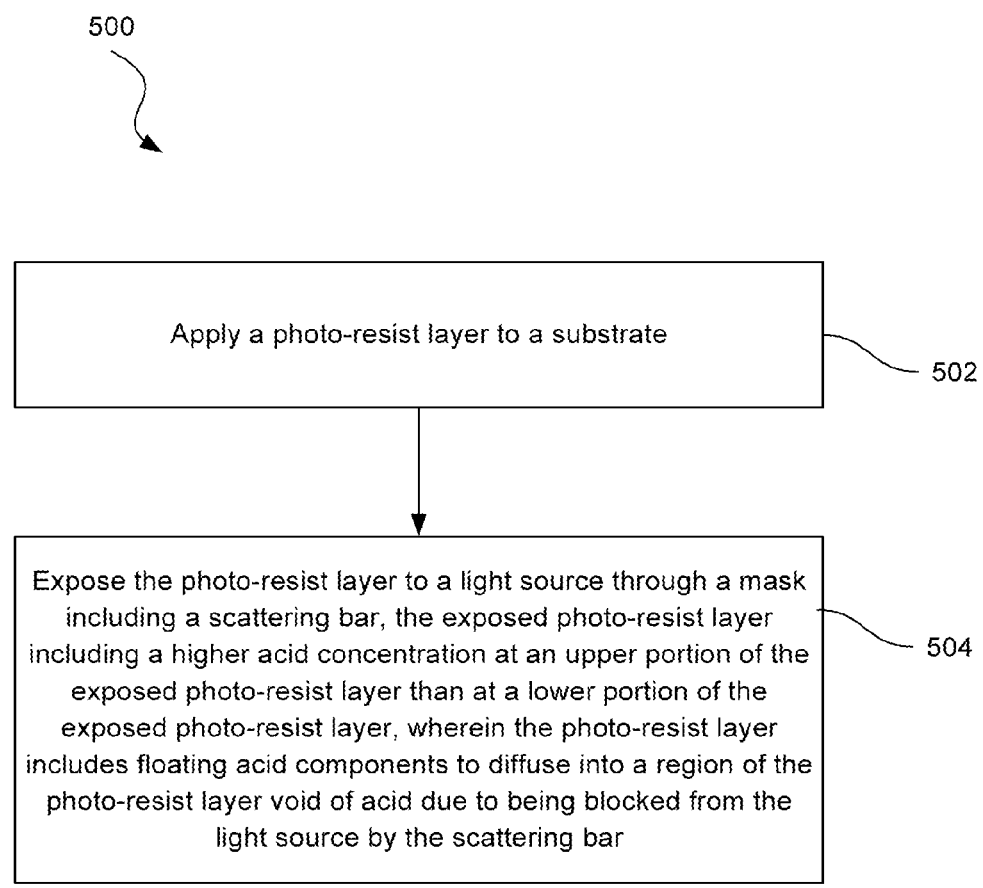
FIG. 5 is a flowchart showing an illustrative method for fabricating a semiconductor product, according to one example of principles described herein.

FIG. 5 is a flowchart showing an illustrative method 500 for fabricating a semiconductor product. According to certain illustrative examples, a method for fabricating a semiconductor product includes a step of applying 502 a positive tone photo-resist layer to a substrate. The method further includes a step of exposing 504 the photo-resist layer to a light source through a mask including a feature. The method further includes a step of using 506 a negative tone developer to develop away regions of the photo-resist layer that are without acid. The photo-resist layer includes floating acid components including one or more of floating Photo Acid Generator (PAG) components, Thermal Acid Generator (TAG) components, or an organic acid.

According to certain illustrative examples, a method for fabricating a semiconductor product includes applying a positive tone photo-resist layer to a substrate, exposing the photo-resist layer to a light source through a mask including a feature, and using a negative tone developer to develop away regions of the photo-resist layer that are without acid. The photo-resist layer includes floating acid components including one or more of floating Photo Acid Generator (PAG) components, Thermal Acid Generator (TAG) components, or an organic acid According to certain illustrative examples, a photo-resist material includes floating acid components including one or more of floating Photo Acid Generator (PAG) components, Thermal Acid Generator (TAG) components, or an organic acid.

According to certain illustrative examples, a method for fabricating a semiconductor product includes exposing a positive tone photo-resist layer to a light source through a mask including a feature, the exposed photo-resist layer including a higher acid concentration at an upper portion of the exposed photo-resist layer than at a lower portion of the exposed photo-resist layer. The method further includes using a negative tone developer to develop away regions of the photo-resist layer that are without acid. The photo-resist layer includes floating acid components to diffuse into a region of the photo-resist layer without acid due to being blocked from the light source by the feature.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating a semiconductor product, the method comprising:
    applying a positive tone photo-resist layer to a substrate, wherein the photo-resist layer includes one or more of: a Photo Acid Generator (PAG), a Thermal Aid Generator (TAG), or an organic acid;
    exposing the photo-resist layer to a light source through a mask including a feature, wherein the exposing includes:
        generating a floating acid component from the one or more of the PAG, the TAG, or the organic acid; and
        diffusing the floating acid component from an exposed region of the photo-resist layer to an unexposed region of the photo-resist layer; and
    using a negative tone developer to develop away regions of the photo-resist layer that are without acid.

2. The method of claim 1, wherein the floating acid component diffuses so as to fill in the unexposed region being void of acid due to being blocked from the light source by the feature.

3. The method of claim 1, wherein the PAG includes and alkyl fluoride group in place of an alkyl group.

4. The method of claim 3, wherein the alkyl fluoride group includes at least 2 carbon units for both an anion unit and a cation unit.

5. The method of claim 1, wherein the PAG is selected from the group consisting of onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compounds, sulfonimide compounds, diazodisulfonate compounds, and disulfone compounds.

6. The method of claim 1, wherein a linking compound links the PAG to a photo-resist material component.

7. The method of claim 1, wherein the TAG includes one of the following formulas:

$$RCOO-CH2CF2SO3-H+; \text{ and}$$

$$RCOO-CH2CF2SO3-(R1)4N+;$$

wherein, R represents a substituted or unsubstituted linear, branched, or cyclic alkyl group having 1 to 20 carbon atoms, or a substituted or unsubstituted aryl group having 6 to 14 carbon atoms, and R1 represents a hydrogen atom, a substituted or unsubstituted linear, branched, or cyclic alkyl group, alkenyl group, ozoalkyl group having 1 to 10 carbon atoms, aryl group, aralkyl group, aryloxoalkyl group having 6 to 18 carbon atoms.

8. The method of claim 1, wherein the organic acid comprises an alkyl group and an acid group with one of acetic, sulfuric, nitric, iodic, or fluoric.

9. A photo-resist material comprising:
    floating acid components including one or more of floating Photo Acid Generator (PAG) components, Thermal Acid Generator (TAG) components, or an organic acid,
    wherein the floating acid component is operable to diffuse from a first region exposed to radiation to a second region having been blocked from radiation by a feature of a mask.

10. The material of claim 9, wherein the PAG components include alkyl fluoride groups in place of alkyl groups.

11. The material of claim 10, wherein the alkyl fluoride group includes at least 2 carbon units for both an anion unit and a cation unit.

12. The material of claim 9, wherein the PAG is selected from the group consisting of onium salts, selenium salts, phosphonium salts, iodinium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

13. The material of claim 9, wherein a linking compound links the PAG components to photo-resist material components.

14. The material of claim 9, wherein the TAG components include one of the following formulas:

$$RCOO-CH2CF2SO3-H+; \text{ and}$$

$$RCOO-CH2CF2SO3-(R1)4N+;$$

wherein, R represents a substituted or unsubstituted linear, branched, or cyclic alkyl group having 1 to 20 carbon atoms, or a substituted or unsubstituted aryl group having 6 to 14 carbon atoms, and R1 represents a hydrogen atom, a substituted or unsubstituted linear, branched, or cyclic alkyl group, alkenyl group, ozoalkyl group having 1 to 10 carbon atoms, aryl group, aralkyl group, aryloxoalkyl group having 6 to 18 carbon atoms.

15. The material of claim 9, wherein the organic acid comprises an alkyl group and an acid group with one of acetic, sulfuric, nitric, iodic, or fluoric.

16. A method for fabricating a semiconductor product, the method comprising:

exposing a positive tone photo-resist layer to a light source through a mask including a feature, the exposed photo-resist layer including a higher acid concentration at an upper portion of the exposed photo-resist layer than at a lower portion of the exposed photo-resist layer; and
using a negative tone developer to develop away regions of the photo-resist layer that are without acid;
wherein the photo-resist layer includes floating acid components operable to diffuse into a second region of the photo-resist layer that is without acid due to being blocked from the light source by the feature.

17. The method of claim 16, wherein the floating acid components include floating Photo Acid Generator (PAG) components.

18. The method of claim 17, wherein the PAG components include alkyl fluoride groups in place of alkyl groups.

19. The method of claim 16, wherein the floating acid components include Thermal Acid Generator (TAG) components.

20. The method of claim 16, wherein the floating acid components include an organic acid.

* * * * *